United States Patent
Arayashiki et al.

(10) Patent No.: US 9,202,846 B2
(45) Date of Patent: Dec. 1, 2015

(54) RESISTANCE RANDOM ACCESS MEMORY DEVICE

(71) Applicant: Kabushiki Kaisha Toshiba, Minato-ku (JP)

(72) Inventors: Yusuke Arayashiki, Kanagawa-ken (JP); Kikuko Sugimae, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 97 days.

(21) Appl. No.: 13/954,169

(22) Filed: Jul. 30, 2013

(65) Prior Publication Data

US 2014/0284536 A1    Sep. 25, 2014

Related U.S. Application Data

(60) Provisional application No. 61/804,421, filed on Mar. 22, 2013.

(51) Int. Cl.
*H01L 27/24* (2006.01)
*H01L 45/00* (2006.01)

(52) U.S. Cl.
CPC ........ *H01L 27/2472* (2013.01); *H01L 27/2481* (2013.01); *H01L 45/085* (2013.01); *H01L 45/1233* (2013.01); *H01L 45/1266* (2013.01); *H01L 45/145* (2013.01); *H01L 45/148* (2013.01)

(58) Field of Classification Search
CPC ..... H01L 45/08; H01L 45/085; H01L 45/124; H01L 277/2463; H01L 277/2472; H01L 277/2481
USPC ........... 257/2–5, E45.001–E45.003, E27.004
See application file for complete search history.

(56) References Cited

U.S. PATENT DOCUMENTS

| | | | | |
|---|---|---|---|---|
| 6,507,061 | B1* | 1/2003 | Klersy et al. | 257/295 |
| 7,658,773 | B2* | 2/2010 | Pinnow | 29/25.03 |
| 8,062,940 | B2* | 11/2011 | Ko et al. | 438/197 |
| 8,134,139 | B2* | 3/2012 | Lin et al. | 257/4 |
| 2010/0051896 | A1* | 3/2010 | Park et al. | 257/4 |
| 2010/0181649 | A1* | 7/2010 | Lung et al. | 257/588 |
| 2011/0240948 | A1 | 10/2011 | Kagawa | |
| 2012/0091415 | A1 | 4/2012 | Sumino et al. | |
| 2013/0313678 | A1* | 11/2013 | Smythe et al. | 257/529 |

FOREIGN PATENT DOCUMENTS

| | | |
|---|---|---|
| JP | 2010-212541 | 9/2010 |
| JP | 2012-174754 | 9/2012 |
| JP | 2012-186316 | 9/2012 |

* cited by examiner

*Primary Examiner* — Allison P Bernstein
(74) *Attorney, Agent, or Firm* — Oblon, McClelland, Maier & Neustadt, L.L.P.

(57) ABSTRACT

A resistance random access memory device according to one embodiment includes an interlayer insulation film which a trench is made therein, an ion supply layer provided along a bottom surface and a side surface of the trench, a portion of the ion supply layer provided along the bottom surface is thicker than a portion of the ion supply layer provided along the side surface, and a resistance change layer provided at least below the ion supply layer.

17 Claims, 11 Drawing Sheets

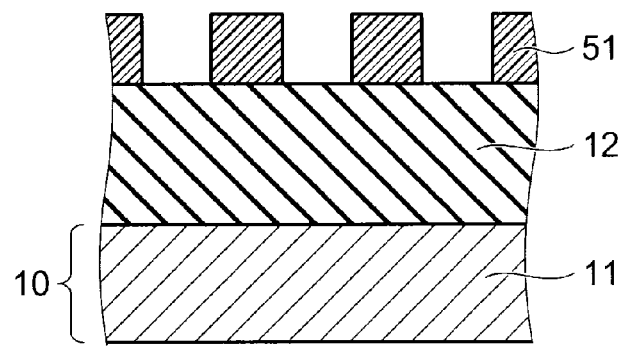
FIG. 2A
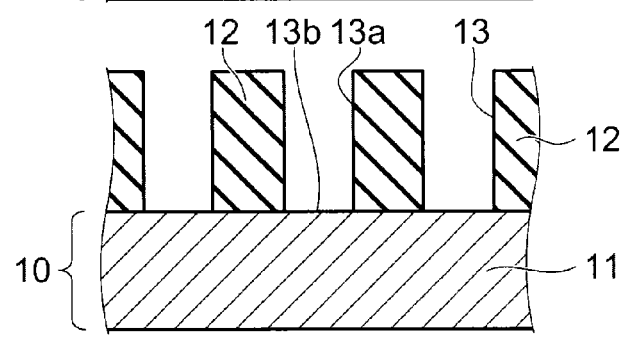
FIG. 2B
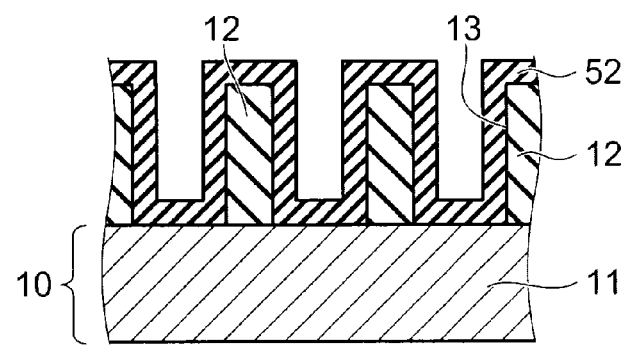
FIG. 2C
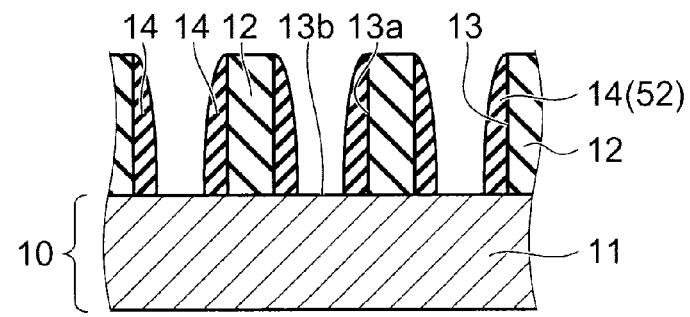
FIG. 2D
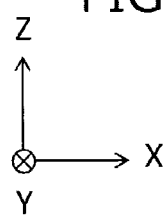

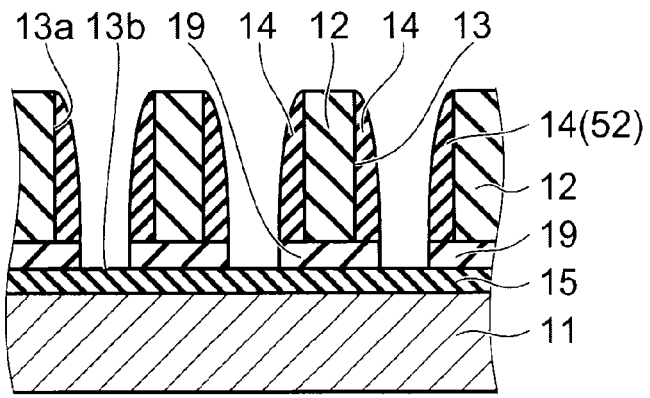
FIG. 8A
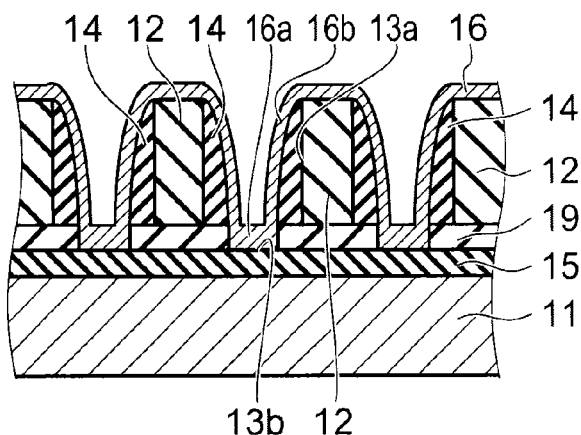
FIG. 8B
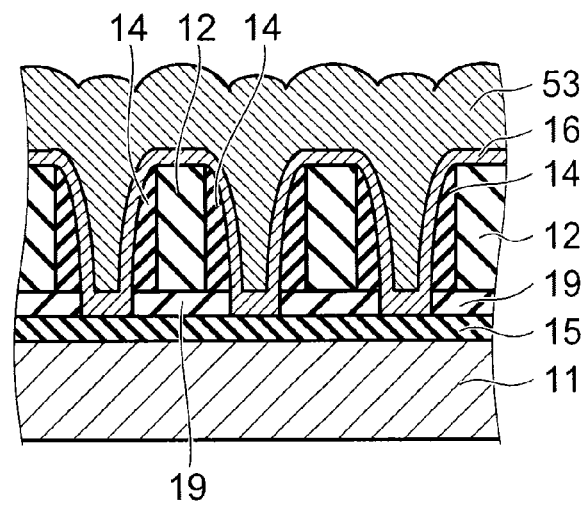
FIG. 8C
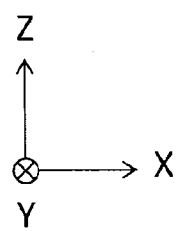

RESISTANCE RANDOM ACCESS MEMORY DEVICE

CROSS-REFERENCE TO RELATED APPLICATIONS

This application is based upon and claims the benefit of priority from U.S. Provisional Patent Application 61/804,421, filed on Mar. 22, 2013; the entire contents of which are incorporated herein by reference.

FIELD

Embodiments described herein relate generally to a resistance random access memory device.

BACKGROUND

In recent years, a resistance random access memory device that stores data by changing a resistance value of a memory cell by causing metal ions to diffuse inside a resistance change layer to cause filaments to appear or disappear has been proposed. In the resistance random access memory device as well, downscaling is necessary to increase the bit density.

BRIEF DESCRIPTION OF THE DRAWINGS

FIG. 2A to FIG. 2D and FIG. 3A to FIG. 3C are cross-sectional views of processes, showing a method for manufacturing the resistance random access memory device according to the first embodiment;

FIG. 7A to FIG. 7C and FIG. 8A to FIG. 8C are cross-sectional views of processes, showing a method for manufacturing the resistance random access memory device according to the second embodiment;

DETAILED DESCRIPTION

A resistance random access memory device according to one embodiment includes an interlayer insulation film which a trench is made therein, an ion supply layer provided along a bottom surface and a side surface of the trench, a portion of the ion supply layer provided along the bottom surface is thicker than a portion of the ion supply layer provided along the side surface, and a resistance change layer provided at least below the ion supply layer.

A resistance random access memory device according to one embodiment includes an interlayer insulation film which a trench is made therein, a height of the trench is larger than a width of the trench, a sidewall formed on a side surface of the trench, a portion of a lower end of the sidewall being thicker than a portion of an upper end of the sidewall, an ion supply layer provided along a bottom surface of the trench and a side surface of the sidewall, and a resistance change layer provided at least below the ion supply layer.

Embodiments of the invention will now be described with reference to the drawings.

First Embodiment

First, a first embodiment will be described.

Figure 1:
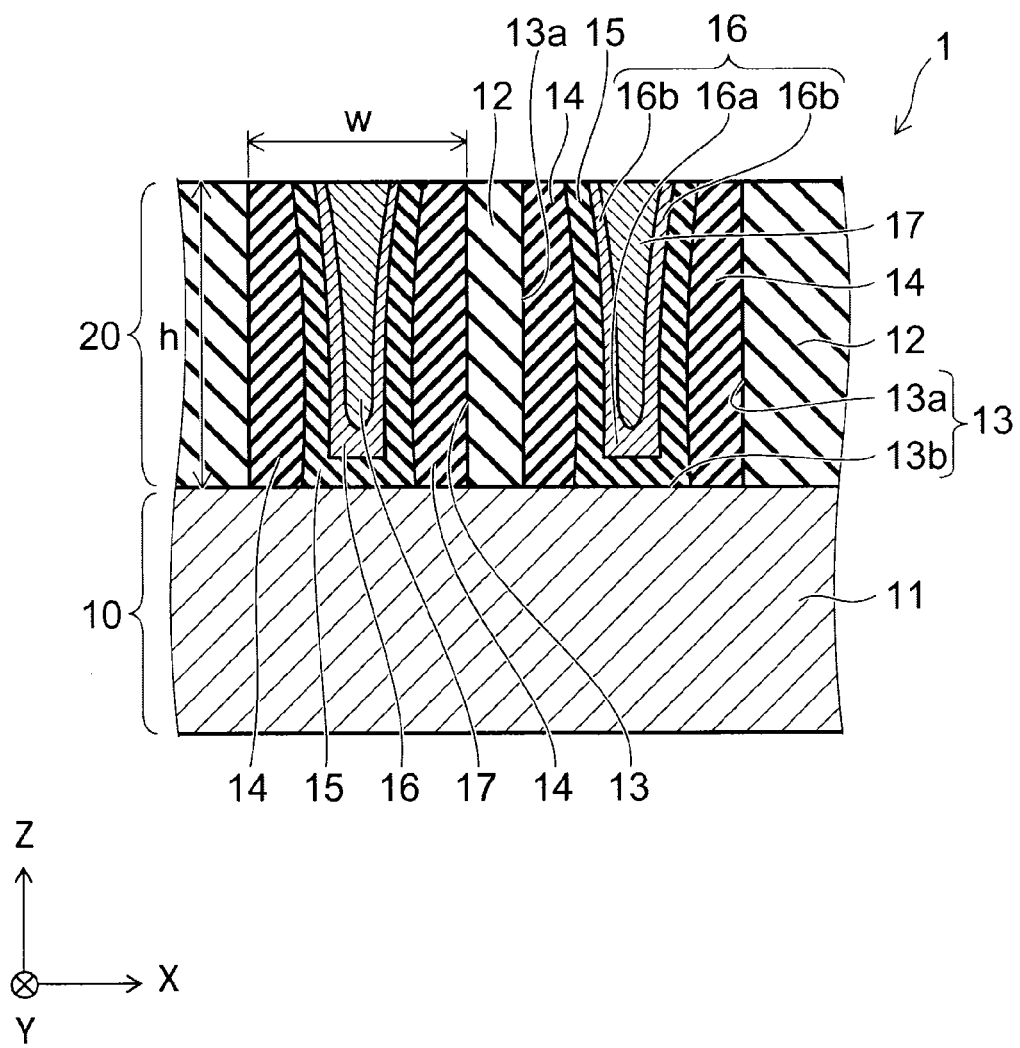
FIG. 1 is a cross-sectional view showing a resistance random access memory device according to a first embodiment.

FIG. 1 is a cross-sectional view showing a resistance random access memory device according to the embodiment.

As shown in FIG. 1, multiple lower wires 11 are provided in the resistance random access memory device 1 (hereinbelow, also called simply "the device 1") according to the embodiment. The lower wires 11 extend in one direction and are arranged at uniform spacing. The lower wires 11 are formed of, for example, tungsten (W) or copper (Cu).

A lower wiring layer 10 includes the multiple lower wires 11 and an inter-wire insulating film (not shown) disposed between the multiple lower wires 11. An XYZ orthogonal coordinate system is employed for convenience of description in the specification. The direction in which the lower wires 11 extend is taken as an X direction.

An interlayer insulation film 12 is provided on the lower wiring layer 10. The interlayer insulation film 12 is formed of, for example, an insulating material having a single composition and is formed of, for example, silicon oxide ($SiO_2$). Multiple trenches 13 that extend in a Y direction are made in the interlayer insulation film 12 to pierce the interlayer insulation film 12 in the direction (a Z direction) of the thickness of the interlayer insulation film 12. A height h of the trench 13 is larger than a width w of the trench 13. Side surfaces 13a of the trench 13 are substantially perpendicular. In other words, the side surfaces 13a are substantially parallel to the YZ plane.

A sidewall 14 is provided on the two side surfaces 13a of the trench 13. The sidewall 14 is formed of, for example, silicon nitride (SiN). The configuration of the sidewall 14 as viewed from the Y direction is a tapered configuration that becomes thinner upward. That is, a portion of a lower end of the sidewall 14 is thicker than a portion of an upper end of the sidewall 14.

A resistance change layer 15 is provided on a bottom surface 13b of the trench 13 and on the side surface 13a of the trench 13, that is, on the upper surface of the lower wiring layer 10 and on the side surface of the sidewall 14. The resistance change layer 15 is provided along the bottom surface 13b and the side surface 13a. Accordingly, the cross-sectional configuration of the resistance change layer 15 is a U-shaped configuration as viewed from the Y direction. In other words, the sidewall 14 is provided between the resistance change layer 15 and the interlayer insulation film 12. The resistance change layer 15 itself is formed of a material having a resistivity higher than that of a metal forming the lower wires 11, and is formed of, for example, silicon oxide or non-doped silicon.

An ion supply layer 16 is provided on the bottom surface 13b of the trench 13 and on the side surface 13a of the trench 13, that is, on the surface of the resistance change layer 15. The ion supply layer 16 also is provided along the bottom surface 13b and the side surface 13a. Accordingly, the cross-sectional configuration of the ion supply layer 16 also is a U-shaped configuration as viewed from the Y direction. The ion supply layer 16 is formed of a metal that is easily ionized and is formed of, for example, silver (Ag). A portion 16a of the ion supply layer 16 that is provided along the bottom surface 13b of the trench 13 is thicker than a portion 16b of the ion supply layer 16 that is provided along the side surface 13a of the trench 13.

In terms of the relationship with the ion supply layer 16, the formation position of the resistance change layer 15 is such that the resistance change layer 15 is disposed below the portion 16a of the ion supply layer 16, which is disposed on the bottom surface 13b, and is disposed between the side surface 13a and the portion 16b of the ion supply layer 16, which is disposed on the side surface 13a.

Further, an upper wire 17 is provided on the ion supply layer 16 inside the trench 13. The upper wire 17 is made of, for example, tungsten (W) or copper (Cu) and extends in the Y direction through the interior of the trench 13. The configuration of the upper wire 17 is a configuration that is thicker at the upper portion than at the lower portion and is a configuration approaching, for example, an inverted trapezoidal configuration or an inverted triangle configuration as viewed from the Y direction because the configuration of the sidewall 14 is a tapered configuration that is thinner at the upper portion than at the lower portion as described above. That is, since the portion of the lower end of the sidewall 14 is thicker than the portion of the upper end of the sidewall 14, a width of an upper surface of the upper sire 17 is larger than a width of a lower surface of the upper sire 17.

An upper wiring layer 20 includes the interlayer insulation film 12, the sidewall 14, the resistance change layer 15, the ion supply layer 16, and the upper wire 17. The upper wiring layer 20 is provided on the lower wiring layer 10.

A method for manufacturing the resistance random access memory device 1 according to the embodiment will now be described.

FIG. 2A to FIG. 2D and FIG. 3A to FIG. 3C are cross-sectional views of processes, showing the method for manufacturing the resistance random access memory device according to the embodiment.

First, as shown in FIG. 2A, the lower wiring layer 10 is formed in which the inter-wire insulating film (not shown) and the lower wires 11 extending in the X direction are arranged alternately. Then, the interlayer insulation film 12 is formed on the lower wiring layer 10. Then, a mask pattern 51 having a line-and-space configuration extending in the Y direction is formed on the interlayer insulation film 12. The mask pattern 51 may be a resist pattern or may include a hard mask.

Then, as shown in FIG. 2B, anisotropic etching such as RIE (reactive ion etching), etc., of the interlayer insulation film 12 is performed using the mask pattern 51 as a mask. Thereby, the trench 13 that extends in the Y direction is made by selectively removing the interlayer insulation film 12. The trench 13 pierces the interlayer insulation film 12 in the Z direction. Accordingly, the bottom surface 13b of the trench 13 includes the upper surface of the lower wiring layer 10. Further, the side surfaces 13a of the trench 13 are substantially perpendicular.

Then, as shown in FIG. 2C, a silicon nitride layer 52 made of silicon nitride is formed on the upper surface of the interlayer insulation film 12 and on the inner surface of the trench 13 by depositing silicon nitride (SiN) by, for example, CVD (chemical vapor deposition). At this stage, the silicon nitride layer 52 is a continuous film that covers the entire interlayer insulation film 12.

Then, as shown in FIG. 2D, etch-back of the silicon nitride layer 52 is performed by, for example, performing anisotropic etching such as RIE, etc. Thereby, the portion of the silicon nitride layer 52 deposited on the upper surface of the interlayer insulation film 12 is removed; the portion of the silicon nitride layer 52 deposited on the bottom surface 13b of the trench 13 is removed; and the portion of the silicon nitride layer 52 deposited on the side surface 13a of the trench 13 remains. By controlling the conditions of the RIE at this time, the portion of the silicon nitride layer 52 deposited on the side surface 13a of the trench 13 is patterned into a tapered configuration that becomes thinner from the lower end toward the upper end. Thereby, the sidewall 14 is formed on the two side surfaces 13a of the trench 13.

Figure 3A:
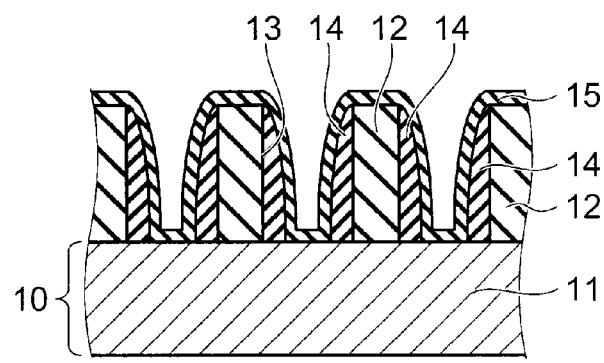

Then, as shown in FIG. 3A, the resistance change layer 15 made of silicon oxide is formed on the upper surface of the interlayer insulation film 12 and on the inner surface of the trench 13 by, for example, depositing silicon oxide ($SiO_2$) by CVD. At this stage, the resistance change layer 15 is a continuous film that covers a structural body made of the interlayer insulation film 12 and the sidewall 14.

Figure 3B:
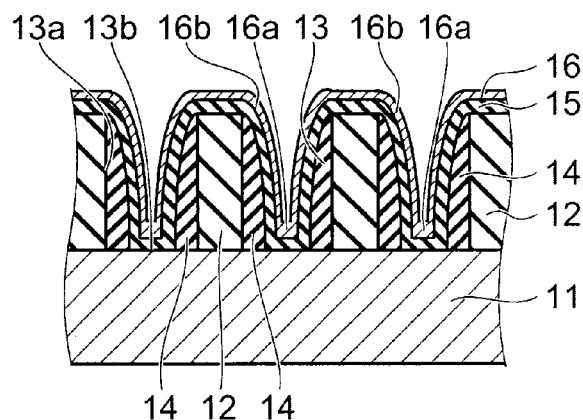

Then, as shown in FIG. 3B, the ion supply layer 16 made of silver is formed on the upper surface of the resistance change layer 15 by, for example, depositing silver (Ag) by sputtering. By adjusting the deposition conditions at this time, the portion 16a of the ion supply layer 16, which is provided along the bottom surface 13b of the trench 13, is caused to be thicker than the portion 16b of the ion supply layer 16, which is provided along the side surface 13a of the trench 13. Also, at this stage, the ion supply layer 16 is a continuous film that covers the resistance change layer 15.

Figure 3C:
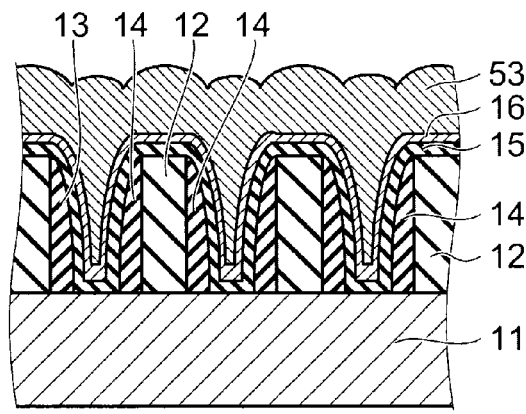

Then, as shown in FIG. 3C, a conductive layer 53 is formed by, for example, depositing an wire material that does not ionize easily such as tungsten, copper, etc. The conductive layer 53 covers a structural body made of the interlayer insulation film 12, the sidewall 14, the resistance change layer 15, and the ion supply layer 16 and is filled also into the trench 13.

Then, as shown in FIG. 1, CMP (chemical mechanical polishing) is performed using the interlayer insulation film 12 as a stopper. The CMP processing is implemented to remove the resistance change layer 15, the ion supply layer 16, and the conductive layer 53 that are on the interlayer insulation film 12. Thereby, as shown in FIG. 1, the portions filled into the interior of the trench 13 remain. At this time, the portion of the conductive layer 53 remaining inside the trench 13 becomes the upper wire 17. Thereby, the upper wiring layer 20 is formed. Thus, the resistance random access memory device 1 is manufactured.

Operations of the resistance random access memory device 1 according to the embodiment will now be described.

In the resistance random access memory device 1 as shown in FIG. 1, a memory cell is included at each of the most proximal points between the lower wires 11, which are used as the source lines, and the upper wire 17, which is used as the bit line. Then, when a positive voltage is applied to cause the upper wire 17 to be positive and cause the lower wire 11 to be negative, a portion of the metal atoms, e.g., the silver atoms, included in the ion supply layer 16 is ionized to become positive ions. The positive ions move toward the lower wire 11 which is negative and enter the resistance change layer 15. Then, the positive ions combine with electrons supplied from the lower wire 11 inside the resistance change layer 15 and precipitate as silver atoms. Thereby, a filament (not shown) made of mainly silver is formed inside the resistance change layer 15 to pierce the resistance change layer 15; and the resistance change layer 15 is switched to the "low resistance state." This operation is called "setting."

On the other hand, when a reverse voltage is applied to cause the lower wires 11 to be positive and to cause the upper wire 17 to be negative, the silver of the filament is ionized to become positive ions that move toward the upper wire 17. Then, the positive ions combine with electrons supplied from the upper wire 17 inside the ion supply layer 16 and again become silver atoms. Thereby, at least a portion of the filament disappears; and the resistance change layer 15 is switched to the "high resistance state." This operation is called "resetting."

Then, data is programmed to each of the memory cells by arbitrarily selecting the "low resistance state" and the "high resistance state." Further, the data that is programmed is read by measuring the electrical resistance value between the lower wire 11 and the upper wire 17.

Effects of the embodiment will now be described.

In the resistance random access memory device, it is favorable to downscale the memory cell size to increase the bit density of the random access memory device. And it is favorable to reduce the thickness of the films that constitute the cells of the memory for making the manufacturing of the memory device easy. Especially, in the case that it is hard to processing the metallic material constituting the ion supply layer by RIE etching, it is necessary to reduce the volume of the metallic material. However, in such a case, the volume of the metallic material constituting the ion supply layer 16 decreases; and the amount of the metal that can be ionized decreases. In the case that the metal that can be ionized is less, it is harder to form the metal filament in resistance change layer; the voltage of "setting" becomes larger. Also, there are cases where the metal that can be ionized is exhausted in the formation process of the filament; the set operation can no longer be performed.

Therefore, in the embodiment, the ion supply layer 16 is formed along the inner surface of the trench 13 such that the cross-sectional configuration is a U-shaped configuration as viewed from the Y direction. Thereby, not only the metal of the portion 16a of the ion supply layer 16 provided on the bottom surface 13b of the trench 13 but also the metal of the portion proximal to the bottom surface 13b of the portion 16b of the ion supply layer 16 provided on the side surface 13a can contribute to the formation of the filament. Accordingly, compared to the case where the ion supply layer 16 is simply a planar layer, the volume of the ion supply layer 16 including the metal that can be ionized can be increased effectively even in the case where the ion supply layer 16 is thin. Also, more of the ion source can be disposed in the vicinity of the portion of the resistance change layer 15 positioned at the most proximal point between the lower wire 11 and the upper wire 17, that is, at the portion where the filament forms easily, because the portion 16a of the ion supply layer 16, which is disposed on the bottom surface 13b of the trench 13, is thicker than the portion 16b of the ion supply layer 16, which is disposed on the side surface 13a of the trench 13. As a result, the switching performance of the memory cells become more stable.

Although there is a possibility of voids occurring due to silver coalescing at the portion 16b disposed on the side surface 13a due to the ion supply layer 16 being formed to be thin, this does not become a large problem because the filament forms with the portion 16a as a starting point. Because it is sufficient for the portion 16b to function as an ion source that supports the portion 16a, the morphology of the portion 16b is not very important. In the case where, for example, silver is used as the material of the ion supply layer 16, the coalescence of the portion 16b of the ion supply layer 16 on the side surface 13a can be suppressed by using a silver alloy instead of silver. For example, a silver-titanium alloy, a silver-tantalum alloy, etc., can be used as the silver alloy.

Also, continuing directly after forming the ion supply layer 16, a capping film (not shown) may be formed by depositing a more stable metal. This also can suppress the coalescence of the ion supply layer 16. The capping film can be formed of titanium, tantalum, tungsten, a nitride of titanium, a nitride of tantalum, a nitride of tungsten, etc. The capping film also may function as a barrier metal of the conductive layer 53.

Also, in the embodiment, the height h of the trench 13 is set to be larger than the width w of the trench 13. Thereby, higher integration of the planar structure can be realized by reducing the arrangement period of the trenches 13 while ensuring the effective volume of the ion supply layer 16 contributing to the formation of the filament.

Further, generally, in the case where the distance between the trenches 13 is shortened for higher integration of the memory cells, a filament is undesirably formed due to the metal ions included in the ion supply layer 16 diffusing inside the interlayer insulation film 12 due to the potential difference applied between an upper wire 17 that is selected and an upper wire 17 that is unselected and positioned to be adjacent to the upper wire 17 that is selected; and shorts occur easily between the upper wires 17.

Therefore, in the embodiment, the sidewall 14 is formed on the side surfaces 13a of the trench 13 such that the structural body made of the upper wire 17, the ion supply layer 16, and the resistance change layer 15 are interposed. The sidewall 14 is formed of a material that can block the diffusion of the metal, e.g., the silver, of the ion supply layer 16 and is formed of, for example, silicon nitride. In the description herein, "being able to block the diffusion" means both the physical diffusion that occurs due to heat, etc., and the electrical diffusion that occurs due to the application of a voltage. For example, a silicon nitride film is favorable as the material of the sidewall in the case where the ion supply layer 16 described above is silver, the sidewall 14 is a silicon nitride film, and the resistance change layer 15 is amorphous silicon or a silicon oxide film because, in addition to the diffusion coefficient of silver in the silicon nitride film being low, there is a tendency for the voltage necessary for the set operation to be higher for the silicon nitride film than for the amorphous silicon and/or the silicon oxide film used in the resistance change layer 15. By using such a structure, the silver included in the ion supply layer 16 can be prevented from forming filaments by diffusing inside the interlayer insulation film 12; and the occurrence of shorts between the mutually-adjacent upper wires 17 can be prevented.

Further, in the embodiment, the configuration of the sidewall 14 is set to be a tapered configuration that becomes thinner from the lower end toward the upper end as viewed from the Y direction. Thereby, the cross-sectional configuration of the upper wire 17 is set to be a configuration that is thicker at the upper portion than at the lower portion. As a result, the position where the filament is formed inside the resistance change layer 15 can be limited by concentrating the electric field by the lower end portion of the upper wire 17 being fine while ensuring the cross-sectional area of the upper wire 17 and while suppressing the wire resistance to be low. Thereby, the number of filaments formed inside the resistance change layer 15 decreases; and thick and tough filaments can be formed. As a result, the electrical resistance value of the low resistance state decreases; the on/off ratio improves; and the data retention characteristics of the low resistance state improve.

Further, in the embodiment, after making the trench 13 in the interlayer insulation film 12, the resistance change layer 15 and the ion supply layer 16 are formed on the inner surface of the trench 13. Therefore, it is unnecessary to pattern the resistance change layer 15 and the ion supply layer 16 inside the trench 13; and these layers are not damaged by patterning. As a result, even in the case where the device 1 is downscaled, a memory cell having good characteristics can be realized.

Comparative Example

A comparative example will now be described.

Figure 4:
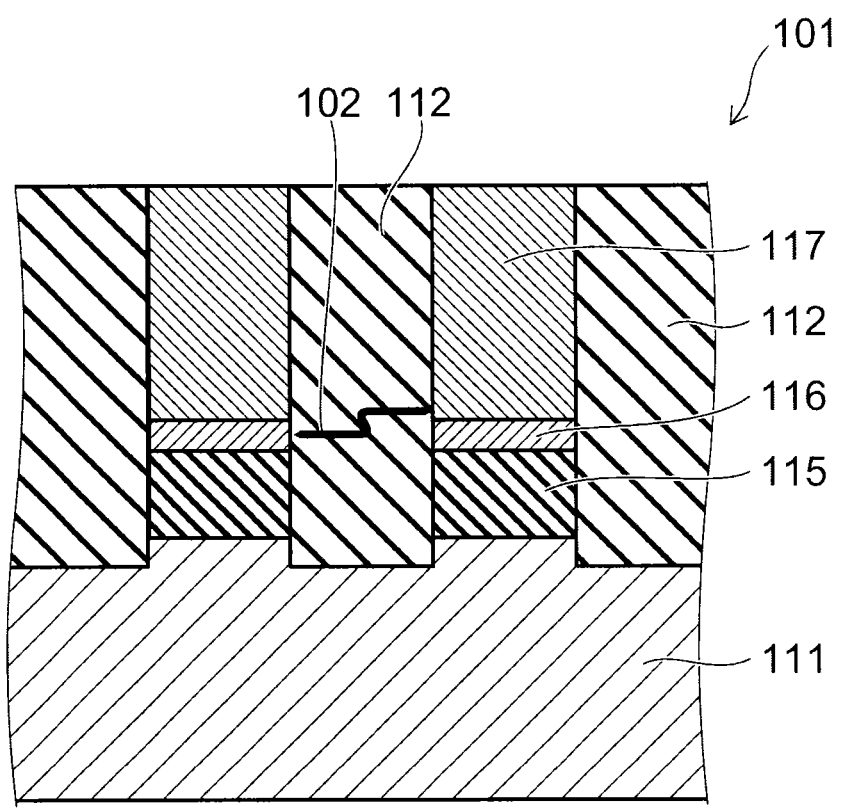
FIG. 4 is a cross-sectional view showing a resistance random access memory device according to a comparative example.

FIG. 4 is a cross-sectional view showing a resistance random access memory device according to the comparative example.

In the resistance random access memory device 101 according to the comparative example as shown in FIG. 4, a resistance change layer 115 and an ion supply layer 116 that are patterned into pillar configurations are formed on a lower wire 111; and an upper wire 117 is formed on the ion supply layer 116. The upper wire 117 extends in a direction orthogonal to the direction in which the lower wire 111 extends. In the description hereinbelow, the results are described for the case where the ion supply layer 116 is formed of silver and the resistance change layer 115 is formed of silicon oxide.

Figure 5A:
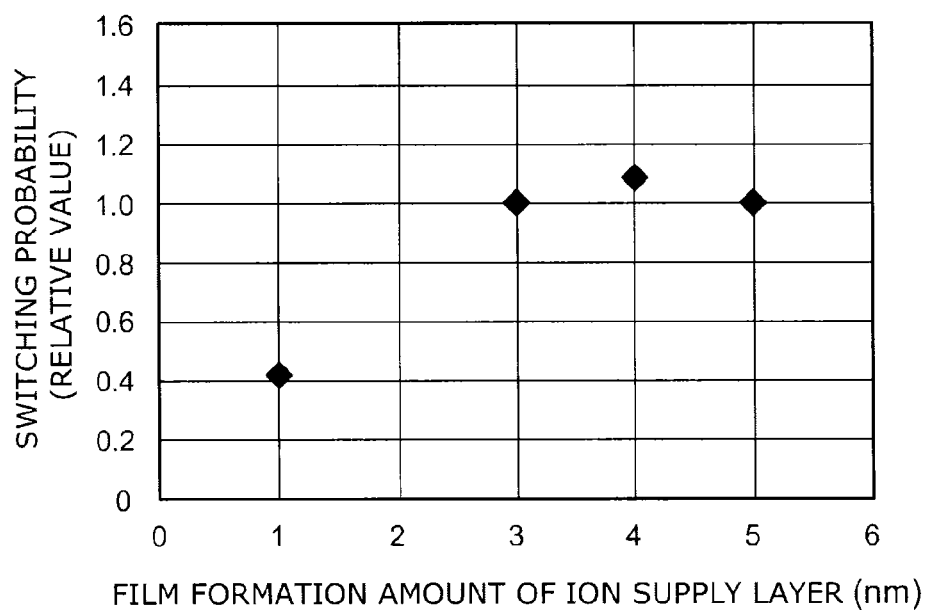
FIG. 5A is a graph showing the effects of the thickness of the ion supply layer on the switching performance, where the horizontal axis is the thickness of the ion supply layer, and the vertical axis is the switching probability of the memory cell.
Figure 5B:
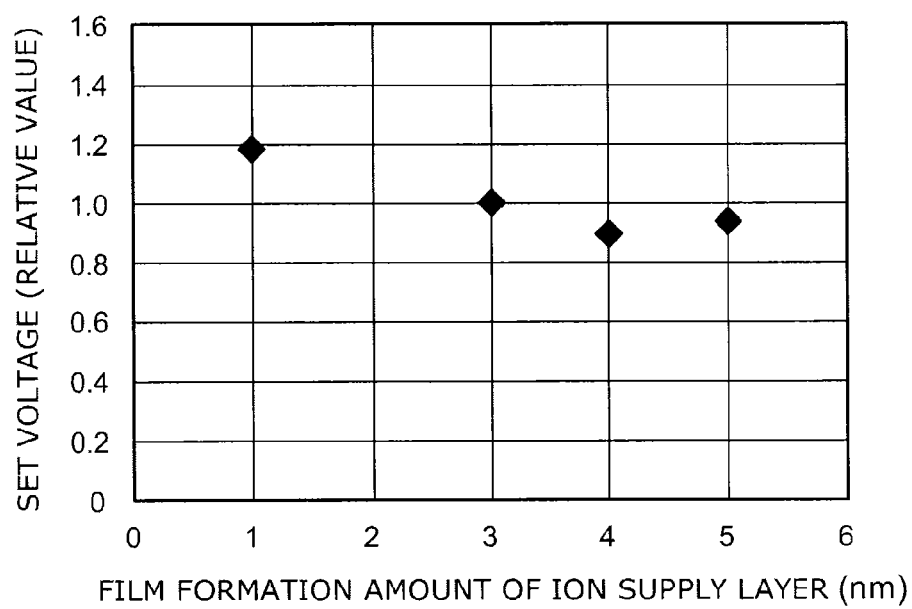
FIG. 5B is a graph showing the effects of the thickness of the ion supply layer on the set voltage, where the horizontal axis is the thickness of the ion supply layer, and the vertical axis is the set voltage of the memory cell.

FIG. 5A is a graph showing the effects of the thickness of the ion supply layer on the switching performance, where the horizontal axis is the thickness of the ion supply layer, and the vertical axis is the switching probability of the memory cell; and FIG. 5B is a graph showing the effects of the thickness of the ion supply layer on the set voltage, where the horizontal axis is the thickness of the ion supply layer, and the vertical axis is the set voltage of the memory cell.

FIG. 5A and FIG. 5B show test results using the resistance random access memory device 101 shown in FIG. 4. In FIG. 5A and FIG. 5B, the value of the vertical axis is a relative value for which the case where the thickness of the ion supply layer 116 is 3 nm is taken to be 1.

As shown in FIG. 5A and FIG. 5B, if the thickness of the ion supply layer 116 is not less than 3 nm, both the switching probability and the set voltage are stable; but a tendency was confirmed in which the switching probability of the memory cell decreases and the set voltage increases in the case where the thickness is less than 3 nm. This is inferred to be because the metal ions that are necessary to form the filament are insufficient and the setting is difficult due to the ion supply layer 116 being set to be thin.

Also, in the resistance random access memory device 101 shown in FIG. 4, in the case where the spacing of the pillars is reduced, a filament 102 is undesirably formed from the ion supply layer 116 of one memory cell toward the ion supply layer 116 or the upper wire 117 of an adjacent memory cell; and there is a possibility that shorts may occur between the mutually-adjacent upper wires 117.

Further, when manufacturing the device 101, the resistance change layer 115 and the ion supply layer 116 are formed as continuous films on the lower wiring layer and are patterned into pillar configurations. Therefore, damage is introduced to the resistance change layer 115 and the ion supply layer 116 due to the patterning; and the characteristics of the memory cell undesirably degrade.

Second Embodiment

A second embodiment will now be described.

Figure 6:
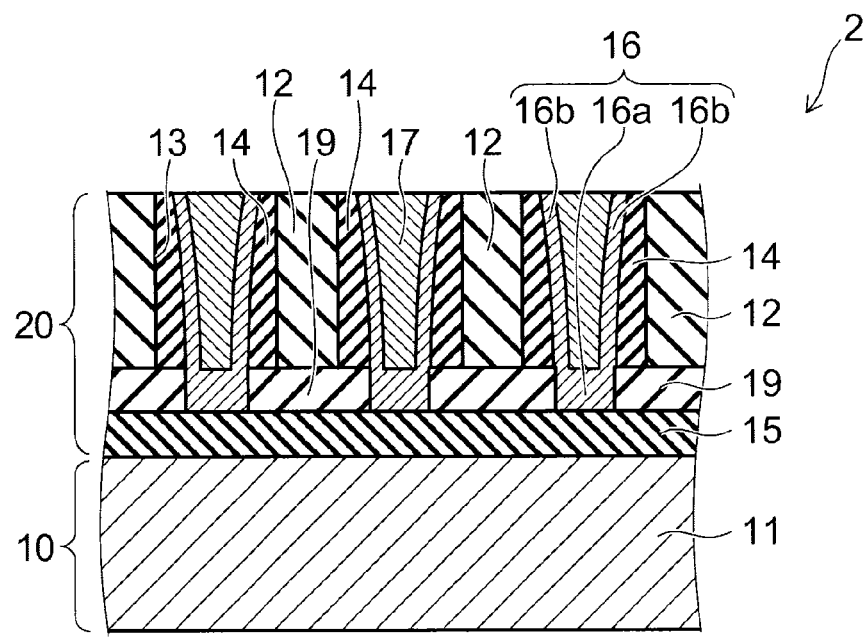
FIG. 6 is a cross-sectional view showing a resistance random access memory device according to a second embodiment.
Figure 6:
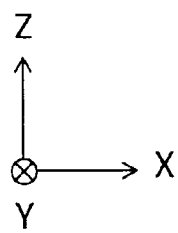

FIG. 6 is a cross-sectional view showing a resistance random access memory device according to the embodiment.

As shown in FIG. 6, the resistance random access memory device 2 according to the embodiment differs from the resistance random access memory device 1 (referring to FIG. 1) according to the first embodiment described above in that the resistance change layer 15 is provided as a continuous film between the lower wiring layer 10 and the interlayer insulation film 12, and a buffer layer 19 is provided between the lower wiring layer 10 and the sidewall 14 and between the lower wiring layer 10 and the portion of the interlayer insulation film 12 between the trenches 13.

The resistance change layer 15 is disposed continuously through the regions directly under the multiple trenches 13 and spreads parallel to the XY plane. Also, the buffer layer 19 is formed of an insulating material that is different from both the material of the interlayer insulation film 12 and the material of the sidewall 14. For example, in the case where the interlayer insulation film 12 is formed of silicon oxide and the sidewall 14 is formed of silicon nitride, the buffer layer 19 can be formed of non-doped amorphous silicon.

In the device 2, the lower wiring layer 10 is formed of the lower wires 11 and the inter-wire insulating film (not shown). Further, the upper wiring layer 20 is formed of the resistance change layer 15, the buffer layer 19, the interlayer insulation film 12, the sidewall 14, the ion supply layer 16, and the upper wire 17.

A method for manufacturing the resistance random access memory device according to the embodiment will now be described.

FIG. 7A to FIG. 7C and FIG. 8A to FIG. 8C are cross-sectional views of processes, showing the method for manufacturing the resistance random access memory device according to the embodiment.

Figure 7A:
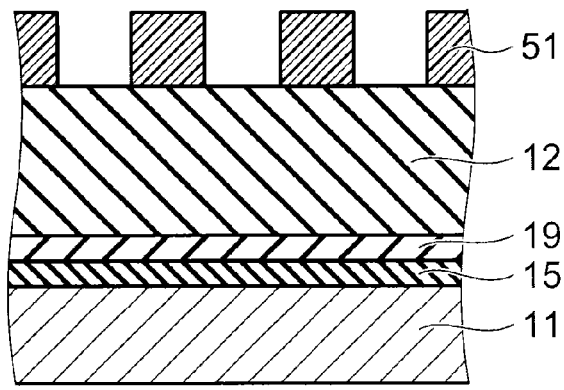

First, as shown in FIG. 7A, the lower wiring layer 10 is formed in which the inter-wire insulating film (not shown) and the lower wires 11 extending in the X direction are arranged alternately. Then, the resistance change layer 15 is formed on the lower wiring layer 10 by, for example, depositing silicon oxide. Continuing, the buffer layer 19 is formed on the resistance change layer 15 by, for example, depositing non-doped amorphous silicon. The resistance change layer 15 and the buffer layer 19 are continuous films that are parallel to the XY plane. Then, the interlayer insulation film 12 is formed on the buffer layer 19 by, for example, depositing silicon oxide. Continuing, the mask pattern 51 having a line-and-space configuration extending in the Y direction is formed on the interlayer insulation film 12.

Figure 7B:
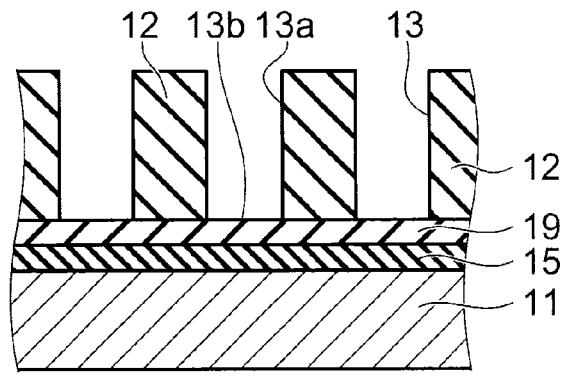

Then, as shown in FIG. 7B, anisotropic etching such as RIE, etc., is performed on the interlayer insulation film 12 using the mask pattern 51 as a mask. The anisotropic etching is performed at conditions such that the etching rate of silicon oxide is higher than the etching rate of silicon. Thereby, the trench 13 extending in the Y direction is made by selectively removing the interlayer insulation film 12. The trench 13 pierces the interlayer insulation film 12 in the Z direction. At this time, the buffer layer 19 is substantially not etched. Accordingly, the bottom surface 13b of the trench 13 includes the upper surface of the buffer layer 19. Also, the resistance change layer 15 is protected by the buffer layer 19 during the etching.

Figure 7C:
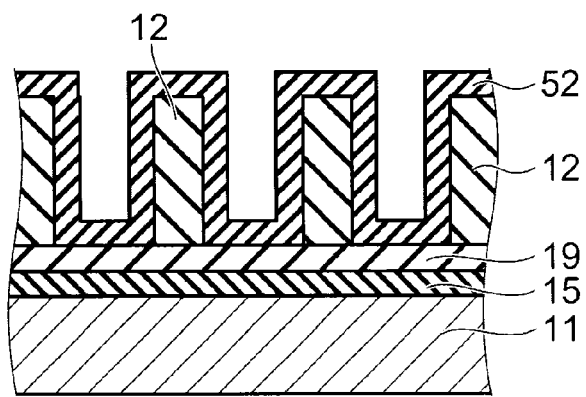

Then, as shown in FIG. 7C, the silicon nitride layer 52 made of silicon nitride is formed on the upper surface of the interlayer insulation film 12 and on the inner surface of the trench 13 by, for example, depositing silicon nitride. At this stage, the silicon nitride layer 52 is a continuous film that covers the entire interlayer insulation film 12.

Then, as shown in FIG. 8A, etch-back of the silicon nitride layer 52 is performed by, for example, performing anisotropic etching such as RIE, etc. Thereby, the portion of the silicon nitride layer 52 deposited on the upper surface of the interlayer insulation film 12 is removed; the portion of the silicon nitride layer 52 deposited on the bottom surface 13b of the trench 13 is removed; and the portion deposited on the side surface 13a of the trench 13 remains. As a result, the sidewall 14 is formed on the two side surfaces 13a of the trench 13. At this time, the sidewall 14 is patterned into a tapered configuration that becomes thinner from the lower end toward the upper end by controlling the conditions of the RIE. Also, the portion of the buffer layer 19 that is not covered with the interlayer insulation film 12 and the sidewall 14 is removed by the etching. Thereby, the resistance change layer 15 is exposed at the bottom surface 13b of the trench 13.

Then, as shown in FIG. 8B, the ion supply layer 16 is formed on the entire surface by, for example, depositing silver (Ag) by sputtering. By adjusting the deposition conditions at this time, the portion 16a of the ion supply layer 16, which is provided along the bottom surface 13b of the trench 13, is caused to be thicker than the portion 16b of the ion supply layer 16, which is provided along the side surface 13a of the trench 13.

Then, as shown in FIG. 8C, the conductive layer 53 is formed by depositing an wire material. The conductive layer 53 covers a structural body made of the resistance change layer 15, the buffer layer 19, the interlayer insulation film 12, the sidewall 14, and the ion supply layer 16 and is filled also into the trench 13.

Continuing as shown in FIG. 6, CMP is performed using the interlayer insulation film 12 as a stopper. The CMP processing is implemented slightly excessively. Thereby, the portions of the conductive layer 53 and the ion supply layer 16 that are deposited on the interlayer insulation film 12 are removed to remain in only the interior of the trench 13. At this time, the portion of the conductive layer 53 remaining inside the trench 13 becomes the upper wire 17. Thereby, the upper wiring layer 20 is formed. Thus, the resistance random access memory device 2 is manufactured.

Effects of the embodiment will now be described.

In the embodiment, in the process shown in FIG. 7A, processing such as patterning, etc., is not performed after the resistance change layer 15 is formed as a continuous film on the lower wiring layer 10. Accordingly, the characteristics of the memory cell are good without introducing damage to the resistance change layer 15 due to the patterning.

Also, in the embodiment, the buffer layer 19 is formed to cover the resistance change layer 15 in the process shown in FIG. 7A. Thereby, the resistance change layer 15 can be protected by the buffer layer 19 in the process of making the trench 13 in the interlayer insulation film 12 shown in FIG. 7B and in the process of forming the sidewall 14 by performing the etch-back of the silicon nitride layer 52 shown in FIG. 8A. Thereby, the damage of the resistance change layer 15 can be prevented.

Further, as shown in FIG. 8A, the buffer layer 19 is removed from the region directly under the trench 13 after forming the sidewall 14. Thereby, the ion supply layer 16 may contact the resistance change layer 15 when the ion supply layer 16 is formed in the process shown in FIG. 8B. As a result, the buffer layer 19 can be prevented from impeding the set operation.

Otherwise, the configuration, the manufacturing method, the operations, and the effects of the embodiment are similar to those of the first embodiment described above.

Modification of Second Embodiment

A modification of the second embodiment will now be described.

Figure 9A:
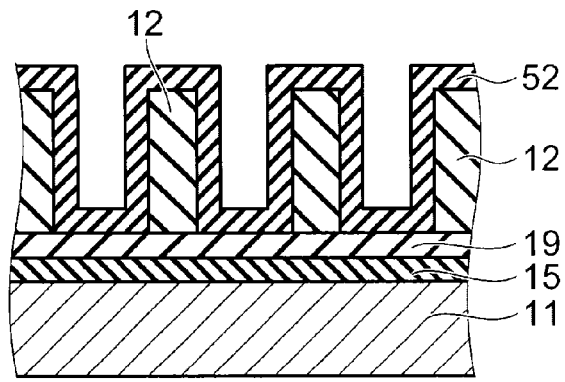
FIG. 9A to FIG. 9C are cross-sectional views of processes, showing a method for manufacturing a resistance random access memory device according to a modification of the second embodiment.
Figure 9B:
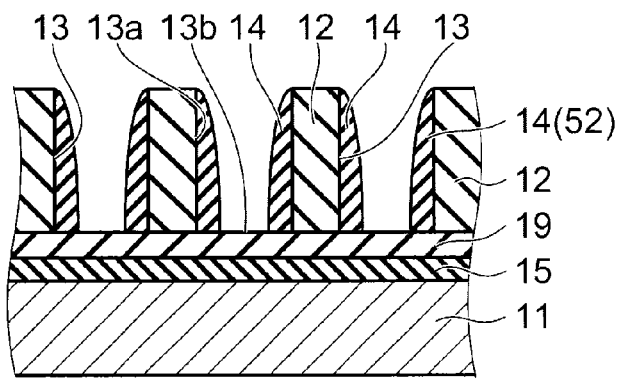
Figure 9C:
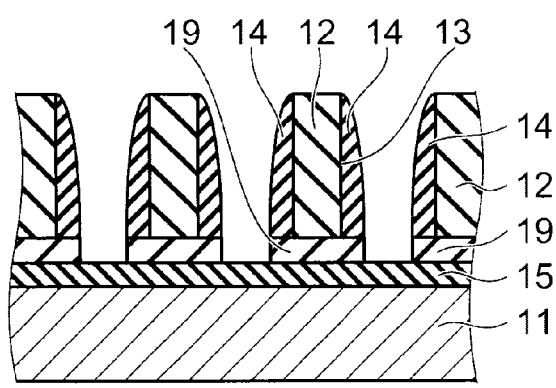

FIG. 9A to FIG. 9C are cross-sectional views of processes, showing a method for manufacturing a resistance random access memory device according to the modification.

The modification differs from the second embodiment described above in that the buffer layer 19 is removed by wet etching in the process shown in FIG. 8A.

First, as shown in FIG. 9A, the processes shown in FIG. 7A to FIG. 7C are implemented.

Then, as shown in FIG. 9B, the sidewall 14 is formed by removing the portion of the silicon nitride layer 52 deposited on the upper surface of the interlayer insulation film 12 and the portion of the silicon nitride layer 52 deposited on the bottom surface 13b of the trench 13 by performing anisotropic etching such as RIE, etc., and by causing the portion of the silicon nitride layer 52 deposited on the side surface 13a of the trench 13 to remain. The sidewall 14 is patterned into a tapered configuration. However, the buffer layer 19 is not removed and remains at this time.

Then, as shown in FIG. 9C, for example, wet etching is performed using a TMAH (tetramethyl ammonium hydroxide) aqueous solution as the etchant. Thereby, the portion of the buffer layer 19, which is made of amorphous silicon, that is formed in the region directly under the trench 13 is removed.

The subsequent processes are similar to the processes shown in FIG. 8B, FIG. 8C, and FIG. 6.

According to the modification, the damage of the resistance change layer 15 can be reduced further by selectively removing the buffer layer 19 by wet etching.

Otherwise, the configuration, the manufacturing method, the operations, and the effects of the modification are similar to those of the second embodiment described above.

Third Embodiment

A third embodiment will now be described.

Figure 10:
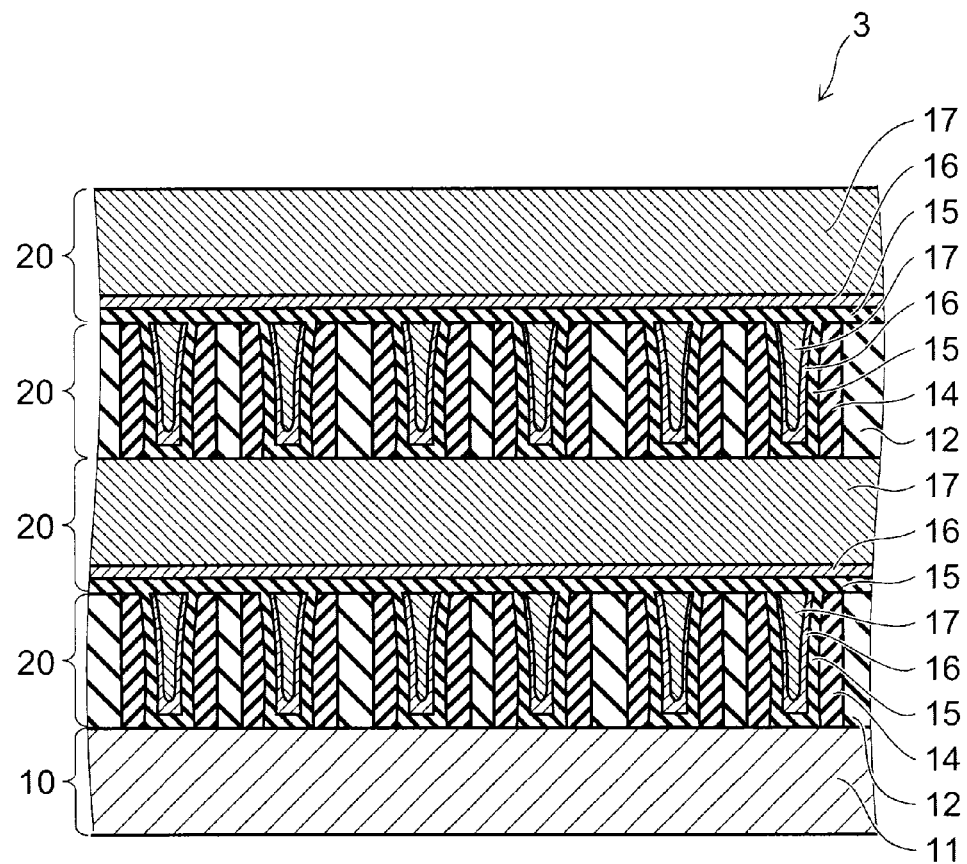
FIG. 10 is a cross-sectional view showing a resistance random access memory device according to a third embodiment.

FIG. 10 is a cross-sectional view showing a resistance random access memory device according to the embodiment.

In the resistance random access memory device 3 according to the embodiment as shown in FIG. 10, multiple upper wiring layers 20 are stacked in the Z direction (the vertical direction) on the lower wiring layer 10 described in the first embodiment described above. In other words, in the device 3, the lower wiring layer 10, the upper wiring layer 20, the upper wiring layer 20, the upper wiring layer 20, . . . , are stacked from the lower layer toward the upper layer. However, the directions in which the trenches 13 extend are orthogonal to each other between mutually-adjacent upper wiring layers 20.

According to the embodiment, the bit density can be increased because the memory cells are integrated three-dimensionally.

Further, in the device 3, the integration in the Z direction can be increased because one upper wire 17 is used as both the source line of the memory cell provided above the one upper wire 17 and the bit line of the memory cell provided below the one upper wire 17.

Otherwise, the configuration, the manufacturing method, the operations, and the effects of the embodiment are similar to those of the first embodiment described above.

Fourth Embodiment

A fourth embodiment will now be described.

Figure 11:
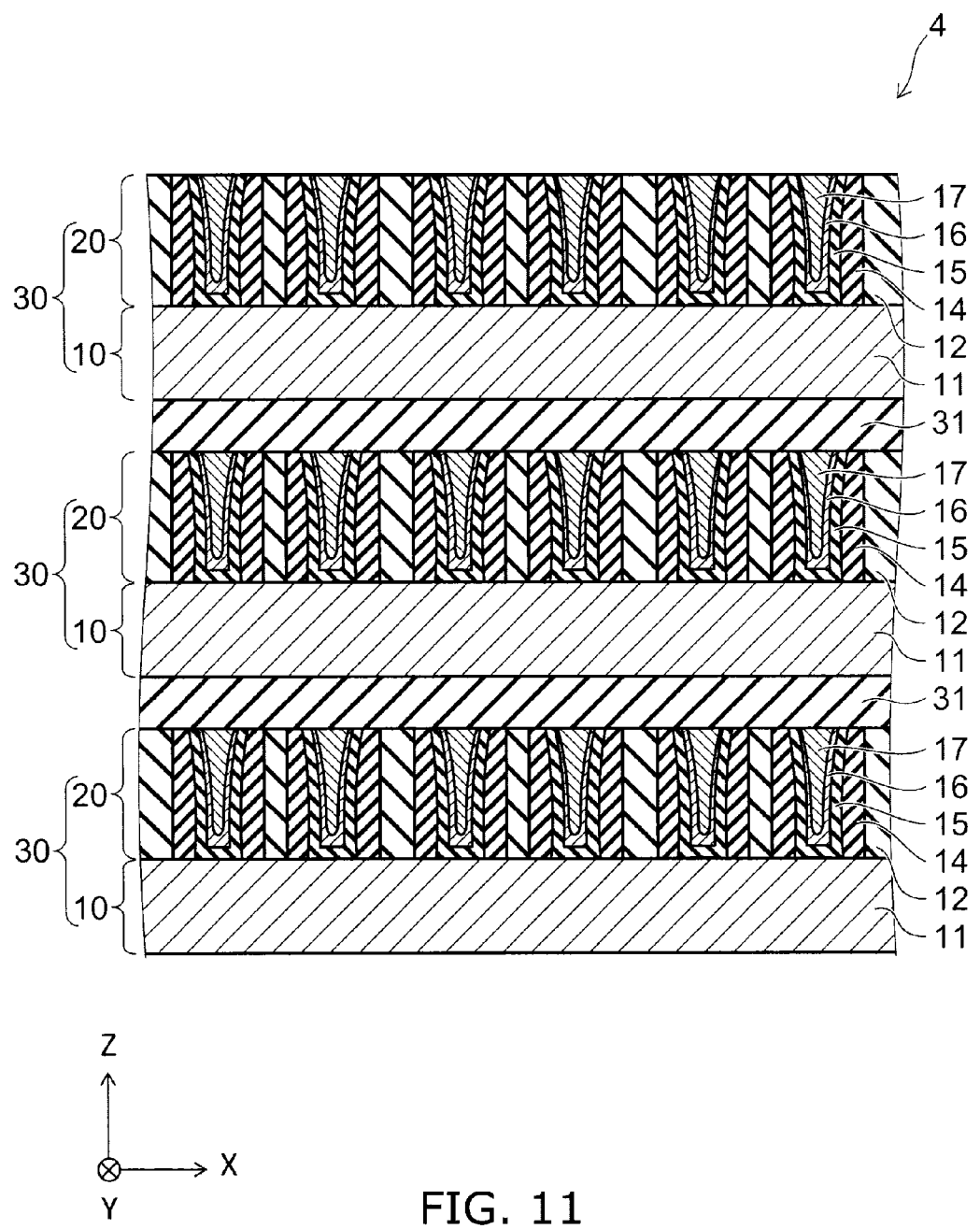
FIG. 11 is a cross-sectional view showing a resistance random access memory device according to a fourth embodiment.

FIG. 11 is a cross-sectional view showing a resistance random access memory device according to the embodiment.

In the resistance random access memory device 4 according to the embodiment as shown in FIG. 11, a memory array layer 30 is formed by one layer of the upper wiring layer 20 being provided on one layer of the lower wiring layer 10; and multiple memory array layers 30 are stacked in the Z direction with an interlayer insulation film 31 interposed. In other words, in the device 4, the interlayer insulation film 31 is disposed between mutually-adjacent memory array layers 30; and the lower wiring layer 10, the upper wiring layer 20, the interlayer insulation film 31, the lower wiring layer 10, the upper wiring layer 20, the interlayer insulation film 31, . . . , are repeatedly stacked from the lower layer toward the upper layer.

According to the embodiment, the bit density can be increased because the memory cells are integrated three-dimensionally.

Further, in the device 4, the control of the driving is easy because the memory array layers 30 made of the lower wiring layer 10 and the upper wiring layer 20 can be driven independently from each other.

Otherwise, the configuration, the manufacturing method, the operations, and the effects of the embodiment are similar to those of the first embodiment described above.

Although an example is illustrated in the embodiments described above in which the resistance change layer 15 is formed of silicon oxide and the ion supply layer 16 is formed of silver, this is not limited thereto.

The material of the resistance change layer 15 may include, for example, a material including silicon such as amorphous silicon (a-Si), polysilicon (poly-Si), silicon oxide ($SiO_2$), silicon nitride ($Si_3N_4$), silicon oxynitride (SiON), or the like, a transition metal oxide such as hafnium oxide ($HfO_x$), hafnium silicon oxide ($HfSiO_x$), hafnium silicon oxynitride (HfSiON), aluminum oxide ($AlO_x$), hafnium aluminum oxide ($HfAlO_x$), zirconium oxide ($ZrO_x$), etc.

Moreover, the embodiments described above can be implemented in combination with each other. For example, although the upper wiring layer 20 shown in the first embodiment described above is used as the structure of the upper wiring layer 20 in the third and fourth embodiments described above, the upper wiring layer 20 shown in the second embodiment described above or a modification of the second embodiment may be used.

According to the embodiments described above, a resistance random access memory device for which downscaling is easy can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A resistance random access memory device, comprising:
    a first wiring layer including a first wire extending in a first direction crossing a vertical direction;
    an interlayer insulation film disposed on the first wiring layer, a trench being made in the interlayer insulation film, the trench extending in a second direction crossing the first direction and the vertical direction;
    an ion supply layer provided along a bottom surface and a side surface of the trench, a portion of the ion supply layer provided along the bottom surface being thicker than a portion of the ion supply layer provided along the side surface, an outside surface of the ion supply layer being tapered so as to enlarge from a bottom to a top of the outside surface, the ion supply layer extending in the second direction;
    a resistance change layer provided at least below the ion supply layer, the resistance change layer extending in the second direction; and
    a second wire provided on the ion supply layer inside the trench, the second wire extending in the second direction.

2. The resistance random access memory device according to claim 1, wherein the resistance change layer is provided also between the ion supply layer and the side surface.

3. The resistance random access memory device according to claim 2, further comprising a sidewall provided between the resistance change layer and the interlayer insulation film.

4. The resistance random access memory device according to claim 1, wherein
    one other trench is made in the interlayer insulation film, and
    the resistance change layer is disposed continuously from a region directly under the trench to a region directly under the one other trench.

5. The resistance random access memory device according to claim 4, further comprising a sidewall provided between the ion supply layer and the interlayer insulation film.

6. The resistance random access memory device according to claim 5, further comprising a buffer layer provided between the resistance change layer and the interlayer insulation film.

7. The resistance random access memory device according to claim 1, further comprising:
    one other interlayer insulation film provided on the interlayer insulation film;
    one other ion supply layer provided in the one other interlayer insulation film, the one other ion supply layer extending in a direction crossing a direction in which the ion supply layer extends; and
    one other resistance change layer provided at least below the one other ion supply layer.

8. The resistance random access memory device according to claim 1, further comprising:
    a first interlayer insulation film provided on the interlayer insulation film;
    a first wiring layer provided on the first interlayer insulation film and including a first wire extending in a direction crossing a direction in which the trench extends;
    a second wiring layer provided on the first wiring layer, the second wiring layer including:

one other interlayer insulation film, one other trench being made in the one other interlayer insulation film, the one other trench extending in a direction in which the trench extends;

one other ion supply layer provided in the one other interlayer insulation film, the one other ion supply layer extending in a direction in which the ion supply layer extends; and one other resistance change layer provided at least below the one other ion supply layer; and a second interlayer insulation film provided on the second wiring layer.

9. The resistance random access memory device according to claim 1, wherein a configuration of the ion supply layer is U-shaped as viewed from a direction in which the trench extends.

10. The resistance random access memory device according to claim 1, wherein the resistance change layer includes silicon.

11. A resistance random access memory device, comprising:

a first wiring layer including a first wire extending in a first direction crossing a vertical direction;

an interlayer insulation film disposed on the first wiring layer, a trench being made in the interlayer insulation film, a height of the trench being larger than a width of the trench, the trench extending in a second direction crossing the first direction and the vertical direction;

a sidewall formed on a side surface of the trench, a portion of a lower end of the sidewall being thicker than a portion of an upper end of the sidewall, the sidewall extending in the second direction;

an ion supply layer provided along a bottom surface of the trench and a side surface of the sidewall, an outside surface of the ion supply layer being tapered so as to enlarge from a bottom to a top of the outside surface, the ion supply layer extending in the second direction;

a resistance change layer provided at least below the ion supply layer, the resistance change layer extending in the second direction; and a second wire provided on the ion supply layer inside the trench, the second wire extending in the second direction.

12. The resistance random access memory device according to claim 11, wherein the resistance change layer is provided also between the ion supply layer and the sidewall.

13. The resistance random access memory device according to claim 11, wherein one other trench is made in the interlayer insulation film, and the resistance change layer is disposed continuously from a region directly under the trench to a region directly under the one other trench.

14. The resistance random access memory device according to claim 13, further comprising a buffer layer provided between the resistance change layer and the interlayer insulation film.

15. The resistance random access memory device according to claim 11, wherein wiring layers are multiply stacked, each of the wiring layers including the interlayer insulation film, the resistance change layer, and the ion supply layer, and the ion supply layers of mutually-adjacent wiring layers extend in directions crossing each other.

16. The resistance random access memory device according to claim 11, further comprising:

a first wiring layer including a first wire extending in a direction crossing a direction in which the ion supply layer extends; and one other interlayer insulation film, a second wiring layer being formed of the interlayer insulation film, the resistance change layer, and the ion supply layer, memory array layers being multiply stacked, each of the memory array layers including the second wiring layer stacked on the first wiring layer, the one other interlayer insulation film being disposed between mutually-adjacent memory array layers.

17. The resistance random access memory device according to claim 11, wherein a configuration of the ion supply layer is U-shaped as viewed from a direction in which the trench extends.

* * * * *